United States Patent
Leak et al.

[11] Patent Number: 6,148,360
[45] Date of Patent: Nov. 14, 2000

[54] NONVOLATILE WRITEABLE MEMORY WITH PROGRAM SUSPEND COMMAND

[75] Inventors: David A. Leak, Rancho Cordova; Fasil G. Bekele, San Francisco; Thomas C. Price, Fair Oaks; Alan E. Baker, Granite Bay; Charles W. Brown, Folsom; Peter K. Hazen, Auburn; Vishram Prakash Dalvi, Fair Oaks; Rodney R. Rozman, Placerville; Christopher John Haid, Folsom; Jerry Kreifels, El Dorado Hills, all of Calif.

[73] Assignee: Intel Corporation, Santa Clara, Calif.

[21] Appl. No.: 08/718,216

[22] Filed: Sep. 20, 1996

[51] Int. Cl.[7] .................................................. G06F 13/24
[52] U.S. Cl. ........................ 710/260; 710/269; 710/47; 711/103; 711/218
[58] Field of Search ..................................... 395/733, 742, 395/867, 868; 711/103; 365/218; 710/260, 269, 47, 48

[56] References Cited

U.S. PATENT DOCUMENTS

| | | | |
|---|---|---|---|
| 4,965,828 | 10/1990 | Ergott, Jr. et al. | 380/50 |
| 5,021,996 | 6/1991 | Watanabe | 364/900 |
| 5,255,314 | 10/1993 | Applegate et al. | 379/212 |
| 5,287,469 | 2/1994 | Tsuboi | 395/425 |
| 5,351,216 | 9/1994 | Salt et al. | 365/230.01 |
| 5,355,464 | 10/1994 | Frandrich et al. | 365/218 |
| 5,369,754 | 11/1994 | Fandrich et al. | 395/425 |
| 5,377,145 | 12/1994 | Kynett et al. | 365/189.05 |
| 5,414,829 | 5/1995 | Fandrich et al. | 395/425 |
| 5,418,752 | 5/1995 | Harari et al. | 365/218 |
| 5,422,843 | 6/1995 | Yamada | 365/185 |
| 5,424,992 | 6/1995 | Coffman et al. | 365/218 |
| 5,424,993 | 6/1995 | Lee et al. | 365/218 |
| 5,465,367 | 11/1995 | Reddy et al. | 365/222 |
| 5,542,076 | 7/1996 | Benson et al. | 710/260 |
| 5,687,121 | 11/1997 | Lee et al. | 365/185.11 |
| 5,742,787 | 4/1998 | Talreja | 395/430 |
| 5,805,929 | 9/1998 | Connolly et al. | 710/49 |

OTHER PUBLICATIONS

Brian Dipert, "Flash Memory Write Protection Techniques", *Intel Application Note,* pp. 11–43—11–49, (Sep. 1993).

Macronix, Inc. "Memory Data Book," pp. 45–1 to 45–2, 46–1 to 46–35 and 47–1 to 47–2, (1995).

*Primary Examiner*—Ario Etienne
*Attorney, Agent, or Firm*—Blakely, Sokoloff, Taylor & Zafman LLP

[57] ABSTRACT

A method and apparatus suspend a program operation in a nonvolatile writeable memory. The nonvolatile writeable memory includes a memory array, a command register and memory array control circuitry. The command register decodes a program suspend command and provides a suspend signal as an output. The memory array control circuitry is coupled to receive the suspend signal from the command register. The memory array control circuitry performs a program operation in which data is written to the memory array. The memory array control circuitry suspends the program operation upon receiving the suspend signal.

13 Claims, 8 Drawing Sheets

NONVOLATILE WRITEABLE MEMORY
WITH PROGRAM SUSPEND COMMAND

FIELD OF THE INVENTION

The present invention relates to the field of memory devices. More particularly, this invention relates to suspending a program operation in a nonvolatile writeable memory in order to perform other operations in the nonvolatile writeable memory.

BACKGROUND OF THE INVENTION

One type of prior art nonvolatile writeable memory is a flash Erasable and Electrically Programmable Read-Only Memory ("flash EPROM" or "flash memory"). A typical flash EPROM has the same array configuration as a standard Electrically Programmable Read-Only Memory ("EPROM") and can be programmed in a similar fashion as an EPROM. Once programmed, either the entire contents of the flash EPROM or a block of the flash EPROM can be erased by electrical erasure in one relatively rapid operation. An erasing voltage is made available to the sources of all the cells in the flash EPROM or in one block of the flash EPROM. This results in a full array erasure or a block erasure. The flash EPROM or the erased block of the flash EPROM may then be reprogrammed with new data.

Flash EPROMs differ from convention Electrically Erasable Programmable Read-Only Memory ("EEPROMs") with respect to erasure. Conventional EEPROMs typically use a select transistor for individual cell erasure control. Flash EPROMs, on the other hand, typically achieve much higher density with single transistor cells.

For a prior art single bit flash EPROM, a logical "one" means that few, if any, electrons are stored on a floating gate associated with a bit cell. A logical "zero" means that many electrons are stored on the floating gate associated with the bit cell. Erasure of the flash EPROM causes a logical one to be stored in each bit cell. Each single bit cell of the flash EPROM cannot be overwritten from a logical zero to a logical one without a prior erasure. Each single bit cell of that flash EPROM can, however, be written from a logical one to a logical zero, given that this entails simply adding electrons to a floating gate associated with the erased state.

Flash EPROMs may be read, programmed (or written), and erased. For a prior art flash EPROM, a program operation to write a byte of data typically takes on the order of 10 microseconds. Because, however, there is some margin required for guaranteeing that the program operation has properly completed, a maximum program time is specified by the flash EPROM manufacturer. Thus, while the typical program operation may take 10 microseconds, the system may need to wait a maximum program operation time of 100 microseconds in order to guarantee that the program operation performed correctly.

Similarly, for a prior art flash EPROM, an erase operation may take from 300–600 milliseconds in order to erase a 8 kilobyte block of data. However, the flash EPROM may require up to a maximum erase operation time of 3 seconds in order to guarantee that the erase operation of the entire block of data has performed correctly.

Because the erase operation has such a long latency time, a prior art flash EPROM includes an erase suspend command. When an erase suspend command is written to the flash EPROM, the flash EPROM suspends the erase operation that is being performed. Other operations may then be performed on the flash EPROM. Subsequently, when an erase resume command is written to the flash EPROM, the flash EPROM resumes the erase operation from where its operation was suspended due to the erase suspend command. An implementation of the erase suspend circuitry is described in U.S. Pat. No. 5,355,464, entitled "Circuitry And Method For Suspending The Automated Erasure Of A Non-Volatile Semiconductor Memory," by Fandrich et al., and issued to the common assignee of this application.

Figure 1:
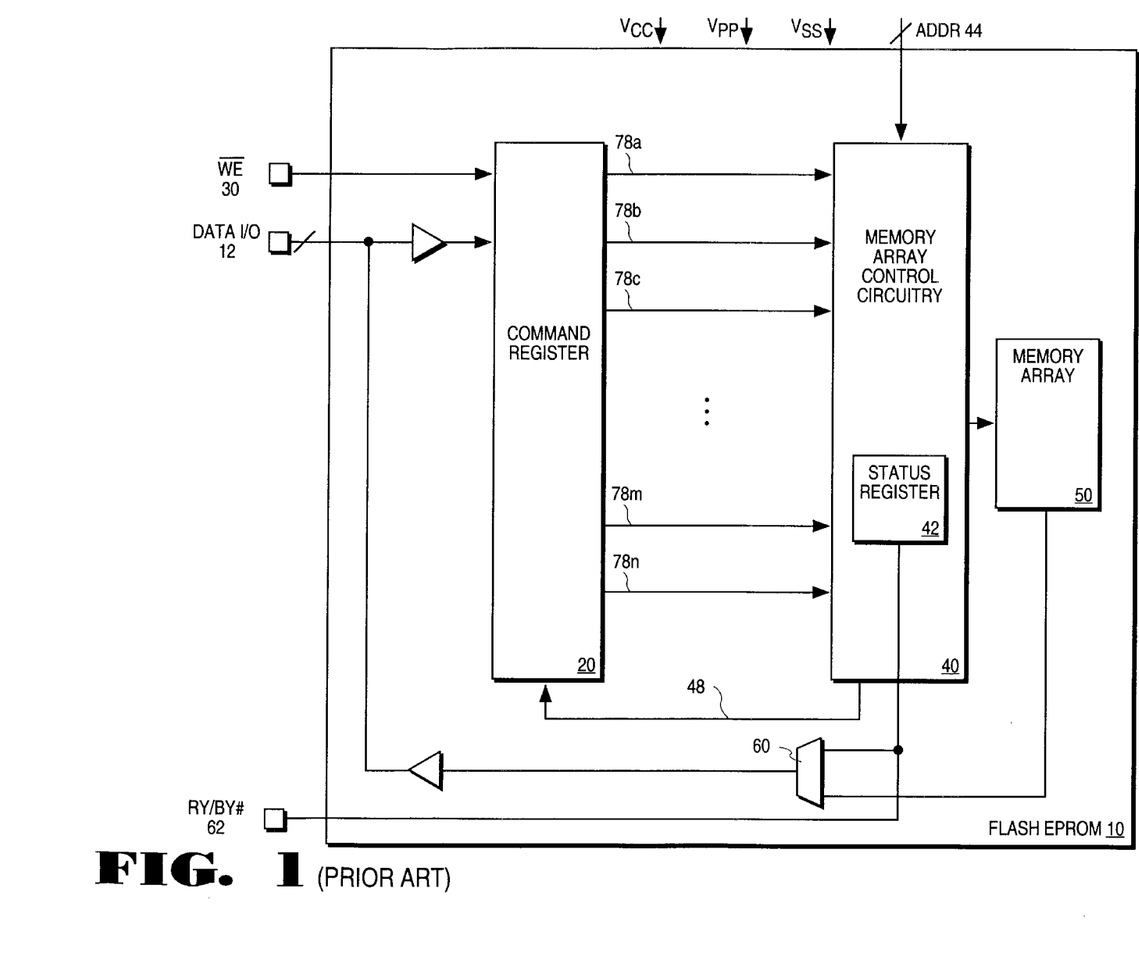
FIG. 1 shows a prior art representation of a flash EPROM.

FIG. 1 shows a representation of a prior art flash EPROM 10. The flash EPROM includes a command register 20, memory array control circuitry 40, and memory array 50.

A number of data input/output (I/O) pins 12 are coupled from pins of the flash EPROM to a command register 20. The number of data I/O pins 12 is usually 8 pins or 16 pins, which matches the size of data to be stored to the flash EPROM. The data I/O pins 12 allow commands to be written to the command register 20. For example, for one prior art flash EPROM, the command decoder includes circuitry for decoding the following commands: (1) erase, (2) erase suspend, (3) erase resume, (4) program, (5) read, and (6) read status. A write enable (WE#) pin 30 is coupled to provide an input to the command register 20.

The command register 20 is coupled to memory array control circuitry 40 via signal lines 78a–n. The memory array control circuitry 40 includes a status register 42. The memory array control circuitry 40 also includes read circuitry, row and column decoder circuitry for accessing and providing data to cells in the memory array 50, and a write state machine, which includes program and erase circuitry. The memory array control circuitry 40 provides the appropriate signals to access the memory array 50 for carrying out the commands provided by the command register 20. The memory array control circuitry 40 receives an address input from address pins 44 of the flash EPROM. A command reset signal 48 is coupled from the memory array control circuitry 40 to the command register 20.

The memory array is coupled to provide data to an output multiplexer 60 for providing data to the data I/O pins 12 of the flash EPROM responsive to a read operation. The status register 42 is also coupled to provide data to the output multiplexer 60 for providing status data to the data I/O pins 12 of the flash EPROM responsive to a read status operation. The status register 42 provides information about the current operation being executed by the flash EPROM. The memory array control circuitry 40 controls the output multiplexer 60 based upon the commands provided to it from the command register 20. The memory array control circuitry 40 selects the status register output to pass through the output multiplexer 60 in response to a read status operation, and the memory array control circuitry selects the memory array output to pass through the output multiplexer 60 in response to a read operation.

In a prior art flash EPROM, a Ready/Busy (RY/BY#) pin 62 of the flash EPROM provides a status indicator of whether the flash EPROM is busy or not. The RY/BY# pin is "low" to indicate a busy state, which signifies that the flash EPROM is performing a block erase operation or a byte write operation. The RY/BY# pin is "high" to indicate a ready state, which signifies that the flash EPROM is ready for new commands, block erase is suspended, or the device is in a powerdown mode. The status register 42 is coupled to provide an output to the RY/BY# pin 62.

Additionally, a supply voltage Vcc, ground potential Vss, and a programming voltage Vpp are provided to the flash EPROM 10.

Figure 2:
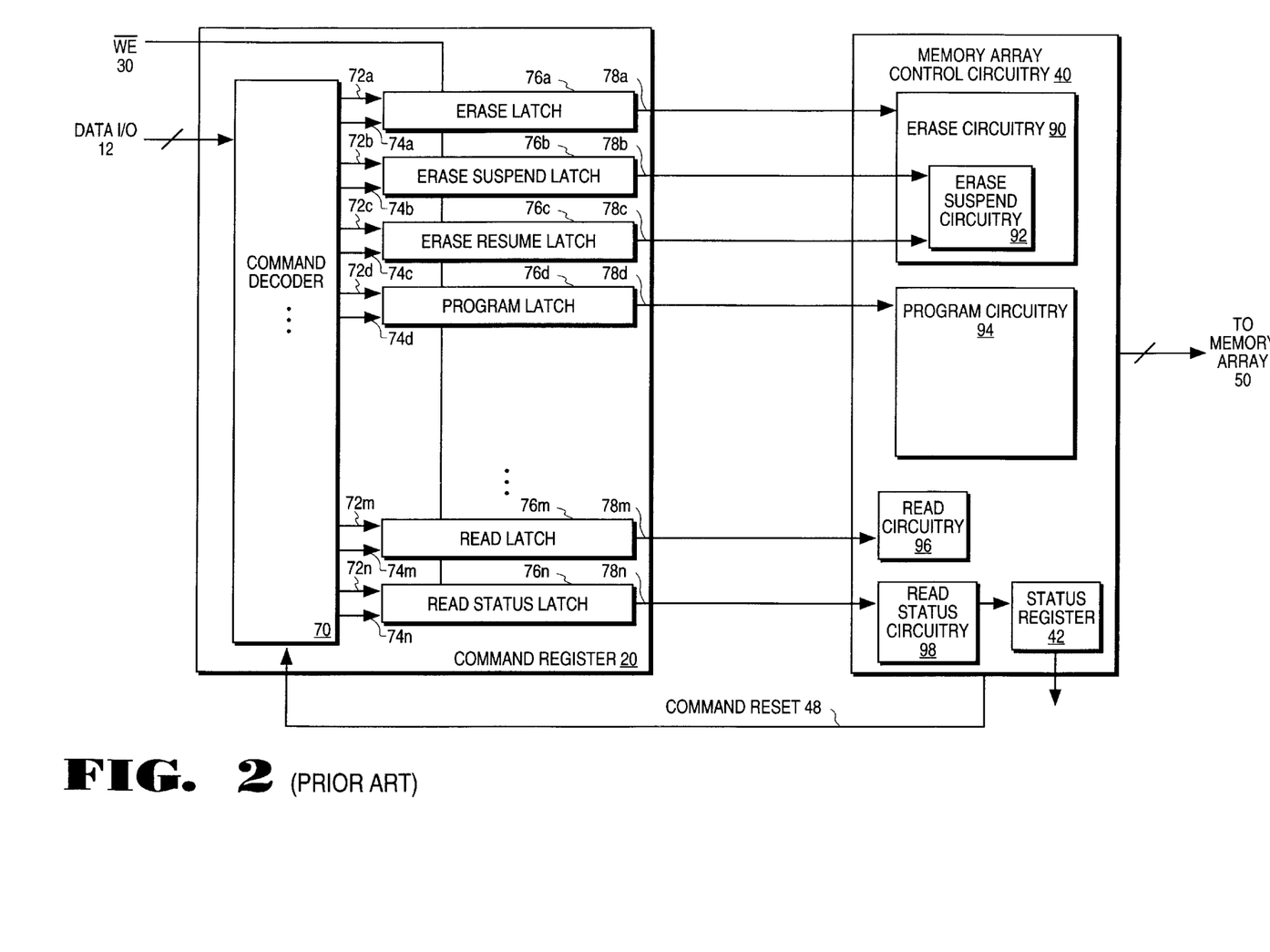
FIG. 2 shows a prior art block diagram of the command register and the memory array control circuitry of the flash EPROM.

FIG. 2 shows a prior art block diagram of the command register 20 and the memory array control circuitry 40. The command register 20 includes a command decoder 70 and command latches 76a–n. The command latches include an erase latch 76a, an erase suspend latch 76b, an erase resume latch 76c, a program latch 76d, a read latch 76m, and a read status latch 76n.

The command decoder decodes the commands it receives from the data I/O pins 12. Each of the commands are provided to an associated command latch 76a–n via the signal lines 72a–n. The command latches 76a–n latch the command upon assertion of the write enable (WE#) pin 30. The command latches 76a–n provide the decoded command to the memory array control circuitry 40 via the signal lines 78a–n.

The memory array control circuitry includes erase circuitry 90, program circuitry 94, read circuitry 96, and read status circuitry 98. Erase circuitry 90 includes erase suspend circuitry 92. Read status circuitry 98 is coupled to the status register 42.

The erase latch 76a, erase suspend latch 76b, and the erase resume latch 76c are coupled to erase circuitry 90. The erase suspend latch 76b and erase resume latch 76c are coupled to erase suspend circuitry 92 within the erase circuitry 90.

The program latch 76d is coupled to program circuitry 94. The read latch 76m is coupled to read circuitry 96, and the read status latch 76n is coupled to read status circuitry 98.

The memory array control circuitry 40 is coupled to provide one or more command reset signals 48 to the command decoder for clearing the command latches 76a–n. The command decoder uses the command reset signals 48 to clear the command latches 76a–n via command latch reset signals 74a–n. For one implementation, there are individual command latch reset signals 74a–n coupled to each command latch 76a–n. For another implementation, one command latch reset signal is coupled to all of the command latches.

Flash EPROMs can be used to store both code and data. In one prior art usage, code is stored in certain blocks of the flash EPROM, and data is stored in other blocks of the flash EPROM. This allows for erasing one block without disturbing the contents of a different block. Additionally, some flash EPROMs provide for data blocks and code blocks of different sizes.

Although it is possible to store both code and data in a flash EPROM and execute code provided directly from the flash EPROM to a processor, a problem arises when a flash EPROM is used in a system that requires servicing of code fetches. This is due to the long latency times for program operations and erase operations, as was previously discussed. For example, if a processor were performing a program operation to write a byte of data to the flash EPROM, and subsequently the processor requested that the flash EPROM perform a read operation in order to perform a code fetch, i.e., a read of code to get new instructions for the processor to execute, the read operation may be delayed up to 100 microseconds waiting for the program operation to complete. This causes the processor to stall: the processor remains idle until it receives new instructions. Such a delay to read code would be unacceptable in a system that requires code fetches to be performed in less time than the maximum program operation time.

Figure 3:
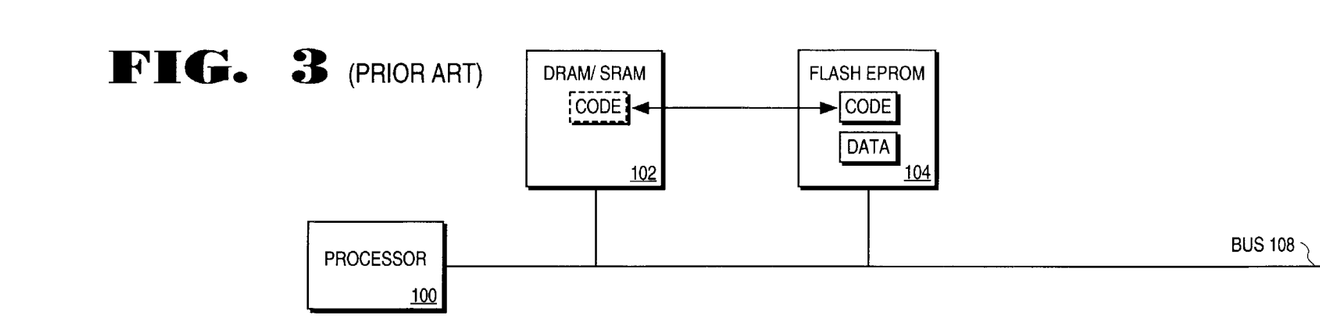
FIG. 3 shows a prior art representation of a system comprising a flash EPROM, a processor and a volatile memory coupled together via a bus.

FIG. 3 shows a prior art representation of a system comprising a processor 100, a volatile memory 102, and a flash EPROM 104 coupled together via a bus 108. The volatile memory 102 and the flash EPROM 104, however, could be coupled to the processor 100, via separate buses. The flash EPROM includes both code and data, wherein the code is executable by the processor. The code of the flash EPROM is shadowed, or copied, to the volatile memory, which may be either dynamic random access memory (DRAM) or static random access memory (SRAM). After the code is shadowed in the volatile memory, if the flash EPROM is performing a program operation and the processor generates a code fetch request, then the processor can satisfy the code fetch request by reading the requested code from the volatile memory. The processor does not need to wait for the flash EPROM to finish its program operation in order to perform a code fetch.

This scheme, however, may be expensive if the size of the code stored in the flash EPROM is large, since the DRAM/SRAM would need to be large enough to store the entire code block in order to overcome the program operation latency. One example of a system which might use the configuration shown in FIG. 3 is a personal computer (PC).

Figure 4:
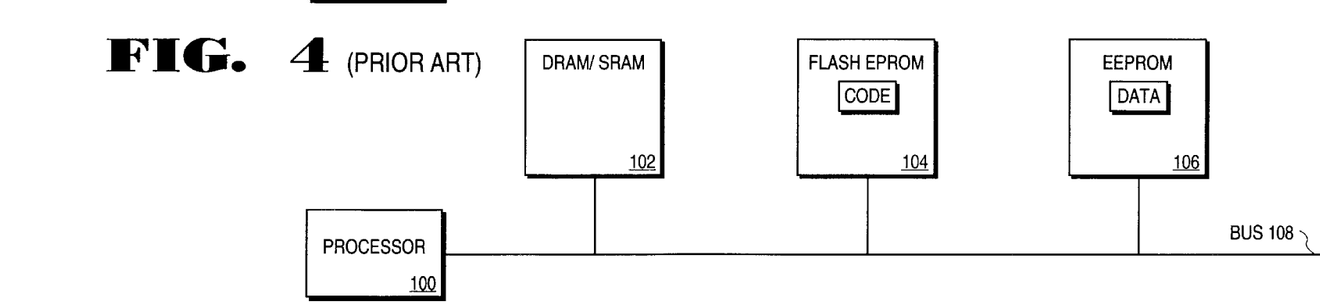
FIG. 4 shows a prior art system that uses an EEPROM to store data.

FIG. 4 shows a prior art system including a processor 100, a volatile memory 102, a flash EPROM 104, and an EEPROM 106. In this prior art system, the EEPROM 106 stores data and the flash EPROM 104 stores code. The SRAM/DRAM 102 is used for temporarily storing data before providing the data to the EEPROM 106, i.e., the SRAM/DRAM serves as a buffer between the processor and the EEPROM.

Figure 5:
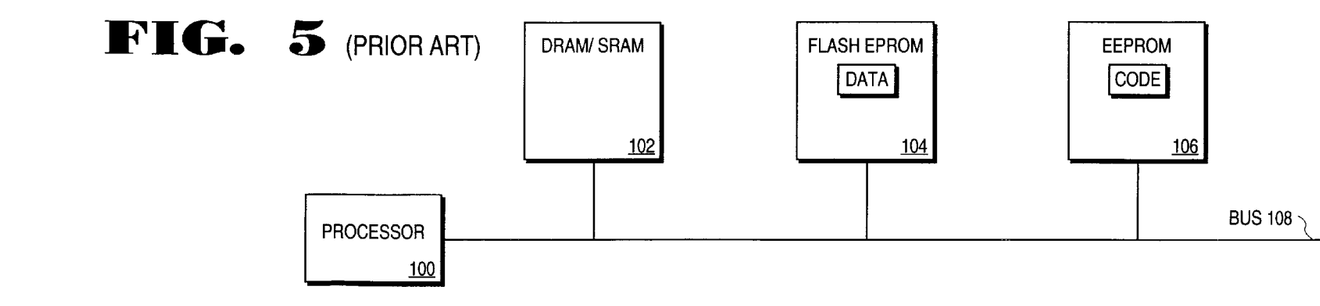
FIG. 5 shows another prior art system which uses an EEPROM to store code.

FIG. 5 shows another prior art system in which the EEPROM 106 stores code, and the flash EPROM 104 stores data. The SRAM/DRAM 102 is used as a temporary buffer between the processor and the flash EPROM.

Thus, FIGS. 3, 4 and 5 show prior art flash EPROM systems that lack the ability to quickly and easily service a processor's code fetch requests while the flash memory is performing a program operation.

SUMMARY OF THE PRESENT INVENTION

An object of this invention is to provide a capability of suspending a program operation in a nonvolatile writeable memory in order to read code from the nonvolatile writeable memory. A desire of this invention is to use a suspend command to suspend a program operation responsive to an interrupt signal.

A method and apparatus for suspending program operations in a flash memory is described. The flash memory includes a memory array, a command register, and memory array control circuitry. The command register decodes a program suspend command and provides a suspend signal as an output. The memory array control circuitry is coupled to receive the suspend signal from the command register. The memory array control circuitry performs a program operation in which data is written to the memory array. The memory array control circuitry suspends the program operation upon receiving the suspend signal.

Other objects, features, and advantages of the present invention will be apparent from the accompanying drawings and from the detailed description that follows below.

DETAILED DESCRIPTION

A method and apparatus for suspending a program operation in a nonvolatile writeable memory in order to read code from the nonvolatile writeable memory is described. Although the detailed description describes embodiments using a flash EPROM, the invention may be used with any nonvolatile writeable memory, including, but not limited to EPROMs, EEPROMs, and flash memories, including technologies such as NOR, NAND, AND, DIvided bit-line NOR (DINOR), and Ferro-electric Random Access Memory (FRAM).

Figure 6:
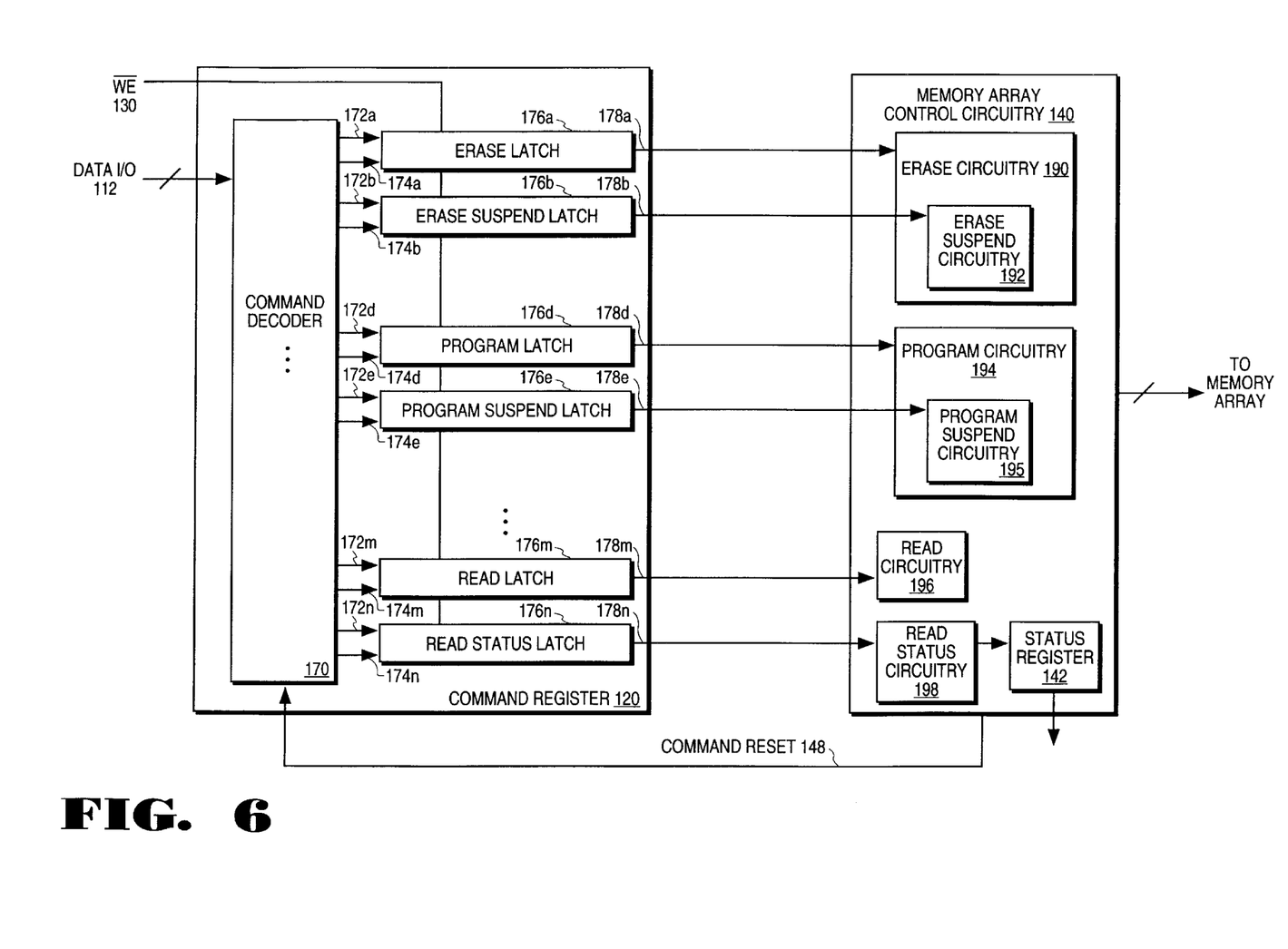
FIG. 6 shows a block diagram of the command register and the memory array control circuitry in accordance with one embodiment of the invention.

FIG. 6 shows a block diagram of the command register 120 and the memory array control circuitry 140 in accordance with one embodiment of the invention.

The command decoder 170 decodes the following commands: (1) erase, (2) erase suspend, (3) erase resume, (4) program, (5) program suspend, (6) program resume, (7) read, and (8) read status. The command decoder provides the decoded command to a corresponding command latch 176*a–n* via signal lines 172*a–n*. The command latches are latched using the write enable (WE#) pin 130.

The erase latch 176*a* is coupled to the erase circuitry 190 via the signal line 178*a*. The erase suspend latch 176*b* is coupled to the erase suspend circuitry 192 of the erase circuitry 190 via the signal line 178*b*.

The program latch 176*d* is coupled to the program circuitry 194 via the signal line 178*d*. The program suspend latch 176*e* is coupled to the program suspend circuitry 195 of the program circuitry 194 via the signal line 178*e*.

The read latch 176*m* is coupled to the read circuitry 196 via signal line 178*m*, and the read status latch 176*n* is coupled to the read status circuitry 198 via signal line 178*n*. The read status circuitry 198 is coupled to status register 142, which is coupled to provide status output to the data I/O and RY/BY# pins.

The memory array control circuitry 140 is coupled to provide one or more command reset signals 148 to the command decoder 170 for clearing the command latches 176*a–n*. The command decoder uses the command reset signals 148 to clear the command latches 176*a–n* via command latch reset signals 174*a–n*. For one embodiment, there are individual command latch reset signals coupled to each command latch 176*a–n*, so that each command latch 176*a–n* can be cleared independently. For another embodiment, one command latch reset signal is coupled to all of the command latches.

When a program suspend command is written to the command decoder, the command decoder provides a program suspend command to the program suspend latch 176*e*. When a program resume command is written to the command decoder, the command decoder 170 clears the program suspend latch 176*e* by asserting the command latch reset signal 174*e*.

For one embodiment, the program suspend command and the program resume command are the same command, but are distinguished from each other based on when they occur. Each time the program suspend/program resume command is written to the command decoder, the command decoder toggles between providing a program suspend command to the program suspend latch 176*e* or clearing the program suspend latch 176*e*.

For another embodiment, a single suspend command is used for both program suspends and erase suspends. A program suspend command and an erase suspend command are distinguished from each other based on when they occur. If an erase operation is being performed when the suspend command is written to the command decoder, then an erase suspend will be performed. If a program operation is being performed when the suspend command is written to the command decoder, then a program suspend will be performed. Furthermore, the program resume and the erase resume commands can be the same as the program suspend/erase suspend commands. The command decoder 122 keeps track of the last operation that was suspended. When the "suspend-resume" command is written to the command decoder while idle or a non-suspendable operation is being performed, then the last operation that was suspended is resumed. Suspended operations can be nested, as will be described with reference to FIG. 10.

The memory array control circuitry 140 interprets the command signals 178*a–n* provided to it and performs a corresponding operation in response to the command signals. The memory array control circuitry 140 includes program suspend circuitry 195 for suspending a program operation of the memory array 150. The memory array control circuitry 140 also includes prior art erase suspend circuitry 192 for suspending an erase operation of the memory array 150. The memory array control circuitry includes a means for storing the state of the suspended non-read operation so that the non-read operation can be resumed later. Non-read operations include program operations and erase operations in the following discussion. For an alternate embodiment, however, other types of operations, such as command operations and status retrieving operations, can be suspended.

A program suspend operation completes its suspend of a program operation within a predetermined amount of time to allow a read operation to be performed with a specified latency. The program suspend operation is initiated by writing a program suspend command to the command decoder 170. For one embodiment, the program suspend completes within 7 microseconds. After this predetermined amount of time, other operations can be performed on the flash EPROM.

Similarly, the erase suspend operation completes within a predetermined amount of time. The erase suspend operation may be initiated by the prior art method of writing an erase suspend command to the command decoder 122. For one embodiment, suspending the erase operation completes within 20 microseconds. After this predetermined amount of time, other operations can be performed.

For one embodiment, it is possible to determine whether a program operation or an erase operation is being performed by accessing the status of the flash EPROM using the read status command. Status can also be determined by the RY/BY# pin 162, as was described previously. Alternatively, a separate pin could be used to provide an indication of whether a program operation or whether an erase operation were being performed.

Figure 7:
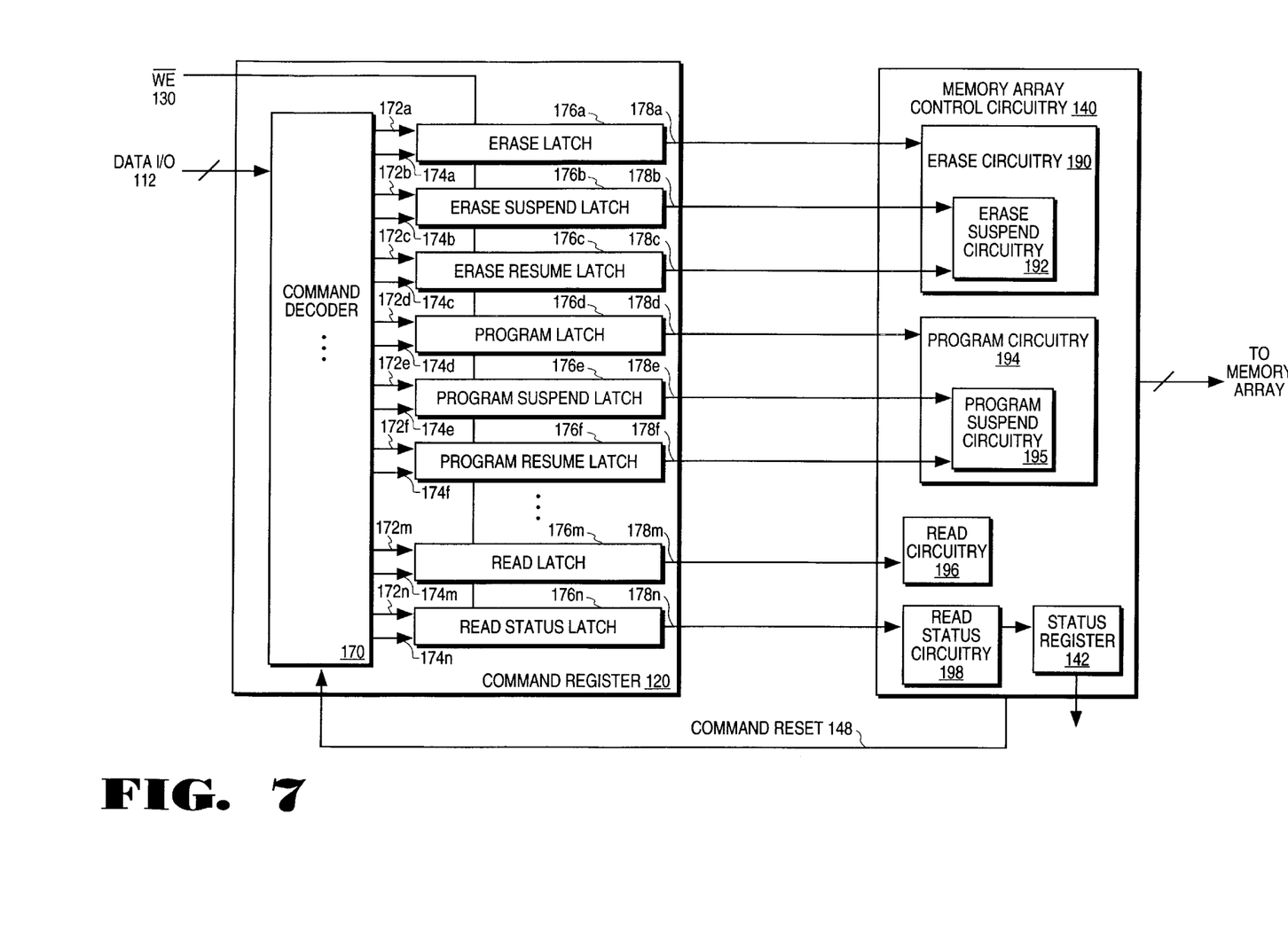
FIG. 7 shows a block diagram of another embodiment of the command register and the memory array control circuitry.

FIG. 7 shows a block diagram of another embodiment of the command register 120 and the memory array control circuitry 140. The command register 120 of FIG. 7 is similar to that of FIG. 6, except that the command decoder of FIG. 7 includes erase resume latch 176c and program resume latch 176e. The erase resume latch 176c is prior art.

The erase resume latch 176c receives a decoded command signal from command decoder 170 via signal line 172c. The erase resume latch 176c is latched upon assertion of the WE# pin 130. The erase resume latch 176c is coupled via signal line 178c to the erase suspend circuitry 192 of the erase circuitry 190. A command latch reset signal 174c is provided from the command decoder 170 to the erase resume latch 176c.

The program resume latch 176f receives a decoded command signal from command decoder 170 via signal line 172f. The program resume latch 176f is latched upon assertion of the WE# pin 130. The program resume latch 176f is coupled via signal line 178f to the program suspend circuitry 195 of the program circuitry 194. A command latch reset signal 174f is provided from the command decoder 170 to the program resume latch 176f.

The program suspend latch 176e provides a signal to the program suspend circuitry 195 in order to suspend a program operation, and the program resume latch 176f provides a signal to the program suspend circuitry 195 in order to resume the suspended program operation.

Figure 8A:
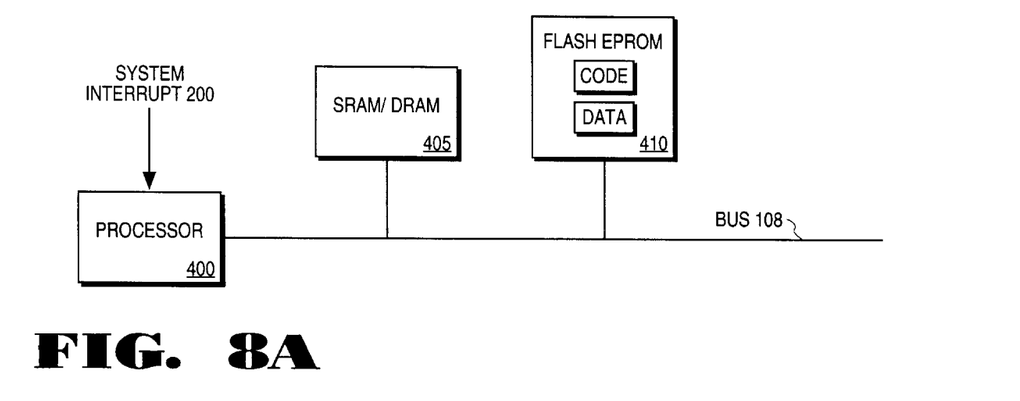
FIG. 8*a* is a block diagram showing a system including a processor, SRAM/DRAM, and flash EPROM coupled together via a bus.
Figure 8B:
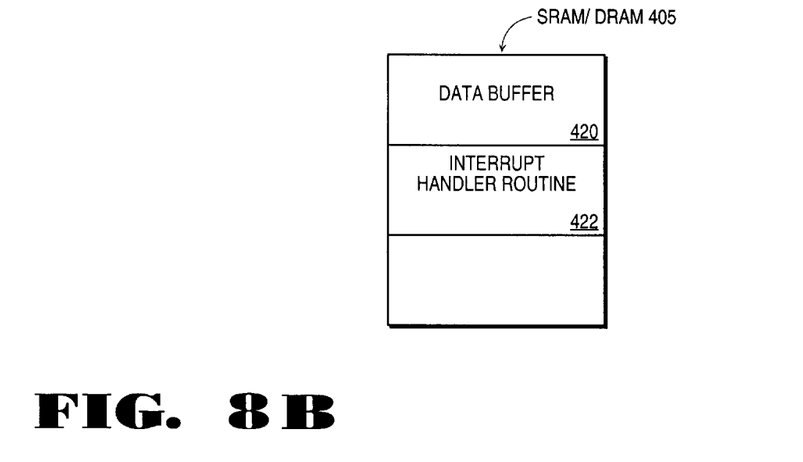
FIG. 8*b* shows the contents of the SRAM/DRAM of FIG. 8*a*.
Figure 8C:
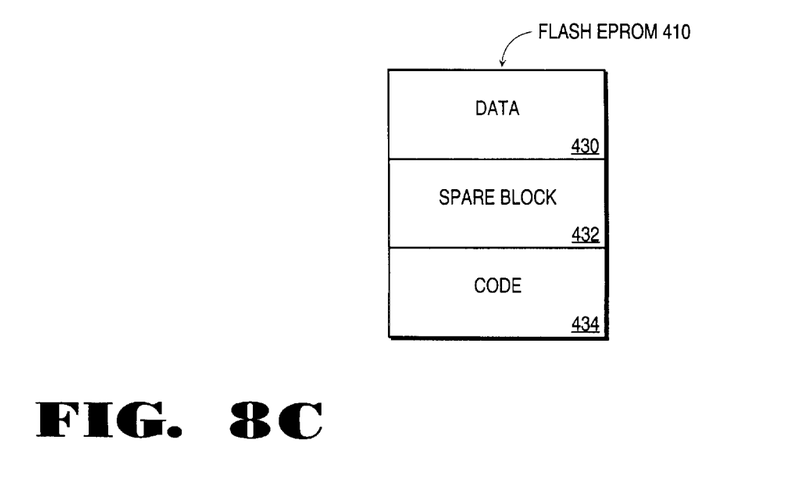
FIG. 8*c* shows the contents of the flash EPROM of FIG. 8*a*.

FIG. 8a is a block diagram showing a system including a processor 400, SRAM/DRAM 405, and flash EPROM 410 coupled together via a bus 108. A system interrupt 200 is coupled to provide an input to the processor 400. For another embodiment, the SRAM/DRAM 405 and the flash EPROM 410 are coupled to the processor 400 via different buses. FIG. 8b shows the contents of the SRAM/DRAM 405 of FIG. 8a, and FIG. 8c shows the contents of the flash EPROM 410 of FIG. 8a.

The SRAM/DRAM 405 includes a data buffer storage area 420. This data buffer storage area is used for temporarily storing data prior to storing it in a data area 430 of the flash EPROM 410. The temporary buffer allows the data to be written relatively quickly to the SRAM/DRAM 405, and then transferred to the flash EPROM 410 when there is time to do so.

The SRAM/DRAM 405 also includes an interrupt handler routine 422. The interrupt handler routine 422 provides the processor 400 with code in response to a system interrupt 200.

The flash EPROM 410 includes a data area 430, a spare block area 432, and a code area 434. The spare block area is used for prior art block management. The code area is used to store various routines which are executable by the processor 400.

For one embodiment, the SRAM/DRAM size is 1 Mbit, or 128 KB, and the flash EPROM size is 8 Mbit.

Figure 9:
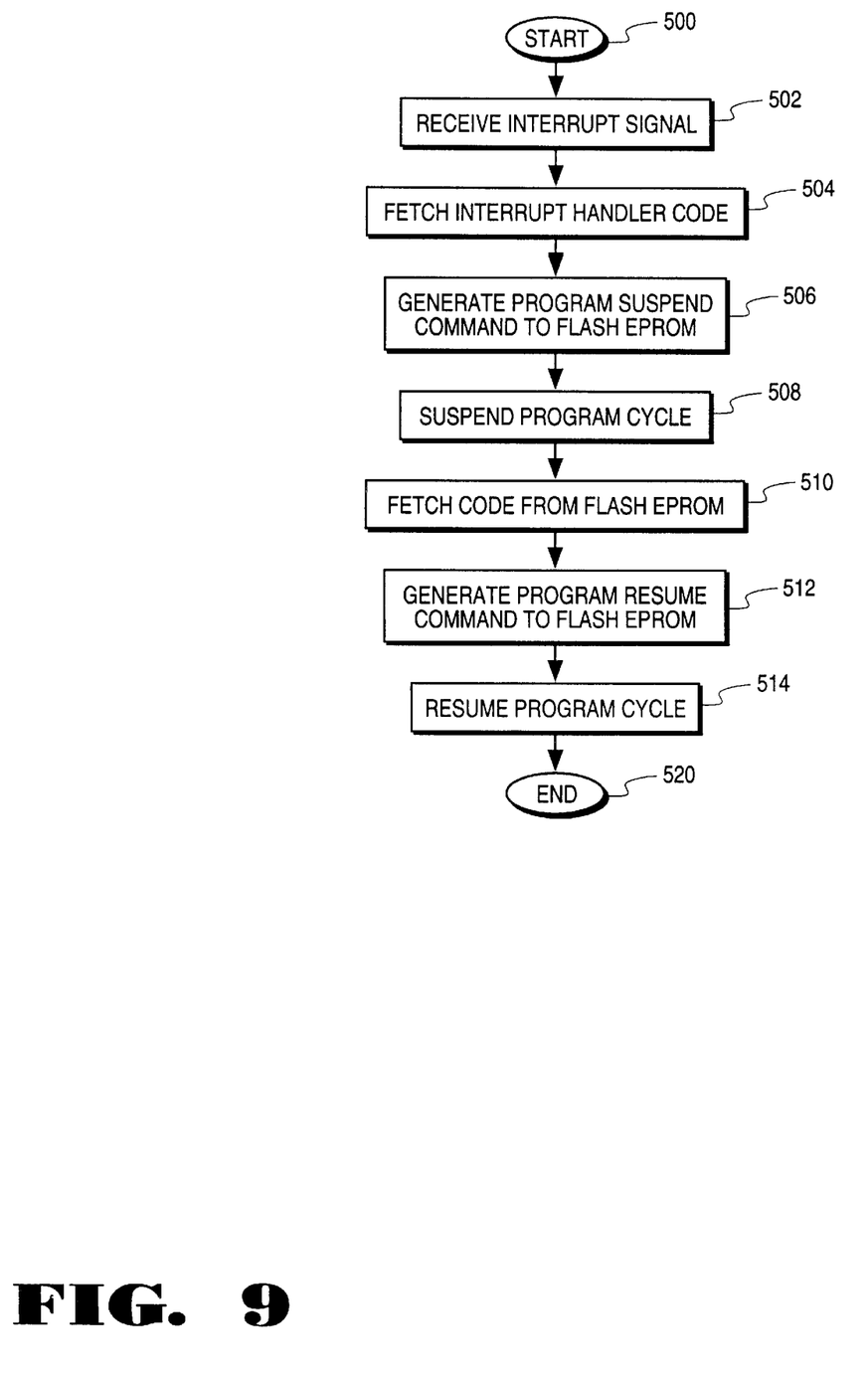
FIG. 9 is a flowchart showing exemplary steps taken by a system having the configuration shown in FIGS. 8*a*, 8*b*, and 8*c*.

FIG. 9 is a flowchart showing exemplary steps taken by a system having the configuration shown in FIGS. 8a, 8b, and 8c. The flowchart begins at block 500 with the processor performing a program operation. From block 500, operation continues at block 502, at which the processor receives a system interrupt signal 200. At block 504, the processor performs a code fetch from the interrupt handler routine 422. For one embodiment, the interrupt handler is stored in the SRAM/DRAM 405. For another embodiment, the interrupt handler is stored within the processor, for example, in a cache or an internal ROM. The interrupt handler routine includes instructions for generating a program suspend command to the flash EPROM 410. The processor 400 executes the interrupt handler routine 422 and generates the program suspend command to the flash EPROM at block 506.

Operation continues at block 508 at which the program operation that was being performed by the flash EPROM is suspended. One or more code fetches are performed from the flash EPROM code area 434 at block 510. Other operations in the flash EPROM are also optionally performed while the program operation is suspended. Operation continues at block 512, at which the processor generates a program resume command to the flash EPROM. The processor 400 generates the program resume command, and at block 514, the program operation is resumed. The flowchart terminates at block 520.

Thus, a method of suspending a program operation using an interrupt handler routine and a program suspend command is described with reference to FIGS. 8a, 8b, 8c, and 9.

Figure 10:
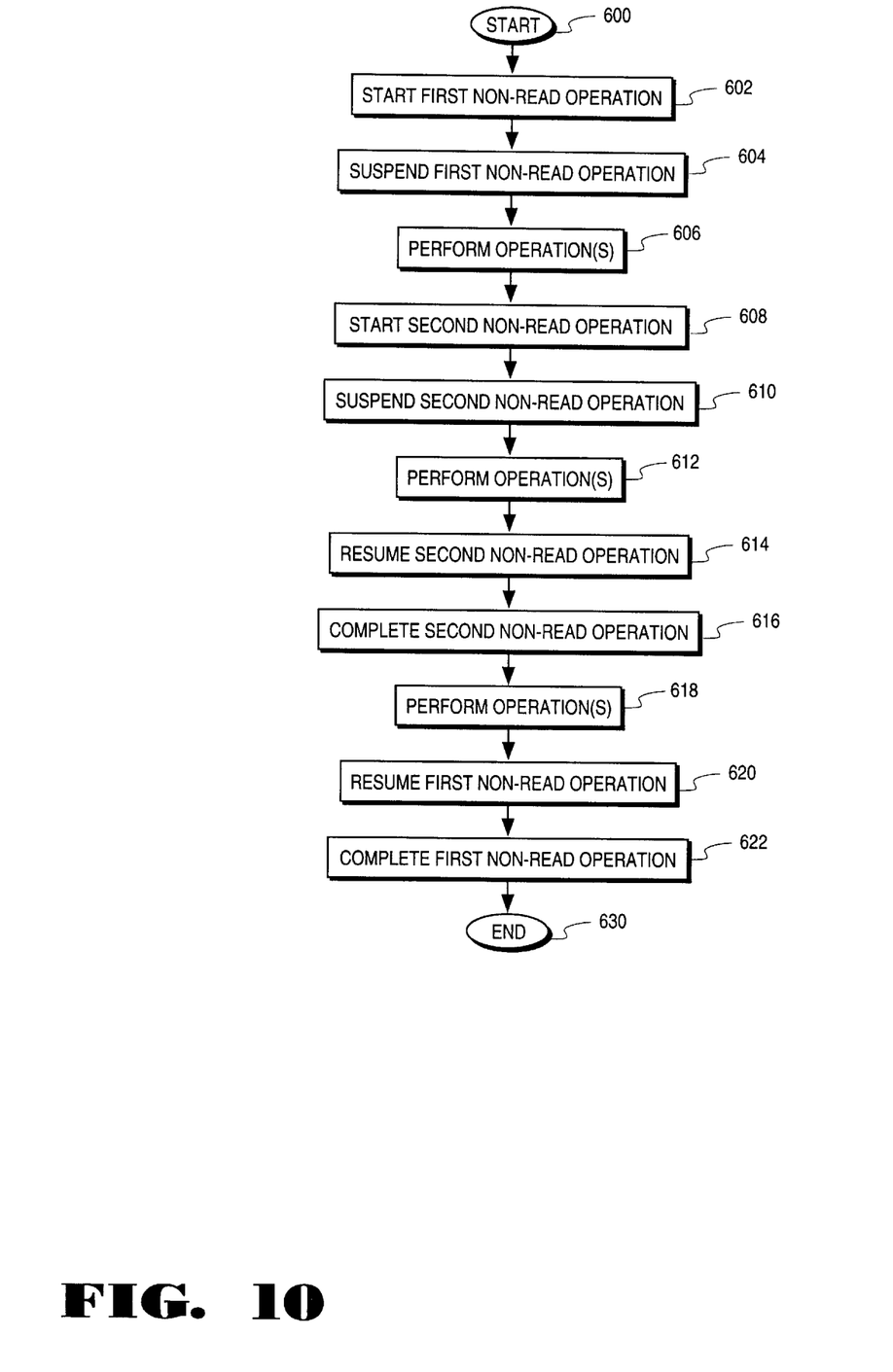
FIG. 10 is a flowchart showing that multiple operations may be suspended using a nesting technique.

FIG. 10 is a flowchart showing that multiple operations may be suspended using a nesting technique. The flowchart starts at block 600. Operation continues at block 602, at which a first non-read operation begins. For one embodiment, only the erase operation may be suspended as the first (or outer) nested suspended operation. For this embodiment, the erase operation has a relatively low priority, such that all other operations can preempt it. The program operation has a higher priority, such that only certain operations can preempt it. For another embodiment, the outer nested suspended operation may be an erase operation, a program operation, a read status operation, or a command operation.

At block 604, the first non-read operation is suspended. The suspend is initiated by writing a suspend command to the command decoder 170. The suspended operation is not resumed until operations initiated during the suspended operation have completed. For one embodiment, the RY/BY# signal will transition to a high level to indicate that the flash memory is ready. A bit in the status word accessed via the read status command, however, indicates that an operation is suspended. For one embodiment, the status word includes one bit for indicating that an erase operation is suspended, one bit for indicating that a program operation is suspended, and one bit indicating whether the write state machine is busy.

At block 606, one or more other operations may be performed. For one embodiment, only certain operations are allowed after the first non-read operation is suspended. For example, if an erase operation has been suspended, then only the following operations will be allowed: read, program, program suspend, program resume, read status, and erase resume.

At block 608, a second non-read operation begins. For one embodiment, the second non-read operation is a program operation. The RY/BY# signal transitions to a low level to indicate that the flash memory is busy.

Operation continues at block 610, at which the second non-read operation is suspended. The RY/BY# signal transitions to a high level to indicate that the flash memory is ready.

One or more operations may be performed at block 612. For one embodiment, only certain operations are allowed while a program operation is suspended. For one embodiment, read, read status, and program resume are the only operations allowed.

At block 614, the second non-read operation is resumed. This is accomplished by writing a resume command to the command decoder 170. The steps corresponding to blocks 610–614 may be performed multiple times during the second non-read operation.

At block 616, the second non-read operation completes. Operation continues at block 618, at which one or more operations may be performed.

At block 620, the first non-read operation is resumed by writing a resume command to the command decoder 170. The steps corresponding to blocks 604–620 may be performed multiple times during the first non-read operation.

At block 622, the first non-read operation completes. The flowchart terminates at block 630.

Although the detailed description described embodiments using a flash EPROM, the invention may be used with any nonvolatile writeable memory, including, but not limited to EPROMs, EEPROMs, and flash memories, including technologies such as NOR, NAND, AND, DIvided bit-line NOR (DINOR), and Ferro-electric Random Access Memory (FRAM).

In the foregoing specification, the invention has been described with reference to specific exemplary embodiments thereof. It will, however be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. In a system comprising a processor and a nonvolatile memory coupled together, a method of reading code from the nonvolatile memory, the method comprising:
    (a) receiving an interrupt signal;
    (b) providing a program suspend command to the nonvolatile memory responsive to the interrupt signal;
    (c) suspending a program operation being performed in the nonvolatile memory;
    (d) reading code from the nonvolatile memory;
    (e) providing a program resume command to the nonvolatile memory; and
    (f) resuming the program operation.

2. The method of claim 1 further comprising:
    (g) executing the code read from the nonvolatile memory.

3. The method of claim 1 wherein (a) further comprises: retrieving an interrupt code from an interrupt handler, the interrupt code including one or more instructions for providing the program suspend command to the nonvolatile memory.

4. The method of claim 1 wherein the system further comprises a volatile memory coupled to the processor, and wherein an interrupt handler is stored in the volatile memory, and (a) further includes retrieving an interrupt code from the interrupt handler, the interrupt code including one or more instructions for providing the program suspend command to the nonvolatile memory.

5. An apparatus comprising:
    circuitry configured to receive an interrupt signal;
    circuitry configured to provide a program suspend command to a nonvolatile memory responsive to the interrupt signal;
    circuitry configured to suspend a program operation being performed in the nonvolatile memory;
    circuitry configured to read code from the nonvolatile memory;
    circuitry configured to provide a program resume command to the nonvolatile memory; and
    circuitry configured to resume the program operation.

6. The apparatus of claim 5, further comprising circuitry configured to execute the code read from the nonvolatile memory.

7. The apparatus of claim 5, wherein the circuitry configured to receive an interrupt signal comprises circuitry configured to retrieve interrupt code from an interrupt handler, the interrupt code including one or more instructions for providing the program suspend command to the nonvolatile memory.

8. The apparatus of claim 5, wherein the apparatus further comprises circuitry configured to provide a volatile memory coupled to a processor, and wherein an interrupt handler is stored in the circuitry configured to provide a volatile memory, and the circuitry configured to receive an interrupt signal comprises circuitry configured to retrieve interrupt code from the interrupt handler, the interrupt code including one or more instructions for providing the program suspend command to the nonvolatile memory.

9. A system comprising:
    a means for receiving an interrupt signal;
    a means for providing a program suspend command to a nonvolatile memory responsive to the interrupt signal;
    a means for suspending a program operation being performed in the nonvolatile memory;
    a means for reading code from the nonvolatile memory;
    a means for providing a program resume command to the nonvolatile memory; and
    a means for resuming the program operation.

10. The system of claim 9, wherein the system further comprises a means for executing the code read from the nonvolatile memory.

11. The system of claim 9, wherein the means for receiving an interrupt signal comprises a means for retrieving interrupt code from an interrupt handler, the interrupt code including one or more instructions for providing the program suspend command to the nonvolatile memory.

12. The system of claim 9, wherein the system further comprises a volatile memory coupled to a processor, and wherein an interrupt handler is stored in the volatile memory, and the means for receiving an interrupt signal comprises a means for retrieving interrupt code from the interrupt handler, the interrupt code including one or more instructions for providing the program suspend command to the nonvolatile memory.

13. In a system comprising a processor and a nonvolatile memory coupled together, a method of reading code from the nonvolatile memory, the method comprising:
    (a) receiving an interrupt signal;
    (b) providing a suspend command to the nonvolatile memory responsive to the interrupt signal;
    (c) suspending a program operation being performed in the nonvolatile memory in response to the suspend command;
    (d) suspending an erase operation being performed in the nonvolatile memory in response to the suspend command;
    (e) reading code from the nonvolatile memory;
    (f) providing a program resume command to the nonvolatile memory;
    (g) providing an erase resume command to the nonvolatile memory;
    (h) resuming the erase operation; and
    (i) resuming the program operation.

* * * * *